United States Patent [19]
Cachier

[11] 4,306,312
[45] Dec. 15, 1981

[54] SYMMETRIC MIXER FOR MILLIMETER WAVES AND A RECEIVER USING SUCH A MIXER

[75] Inventor: Gérard Cachier, Paris, France
[73] Assignee: Thomson-CSF, Paris, France
[21] Appl. No.: 132,427
[22] Filed: Mar. 21, 1980
[30] Foreign Application Priority Data
Mar. 23, 1979 [FR] France ............................ 79 07386
[51] Int. Cl.³ ........................ H01P 5/12; H03D 7/02
[52] U.S. Cl. ................................ 455/328; 455/326; 455/330; 329/203; 329/160; 331/42
[58] Field of Search ............... 455/325, 326, 327, 328, 455/330, 331, 332; 329/160, 161, 163, 164, 116, 203, 204; 331/42; 332/43 B, 47, 52

[56] References Cited
U.S. PATENT DOCUMENTS

| | | | |
|---|---|---|---|
| 2,576,481 | 11/1951 | Rodwin | 445/328 |
| 2,761,061 | 8/1956 | Mattern | 445/328 |
| 3,271,686 | 9/1966 | Bock | 445/327 |
| 3,538,465 | 11/1970 | Manning | 329/161 |
| 3,638,126 | 1/1972 | Spacek | 445/328 |
| 3,654,556 | 4/1972 | Wen | 445/328 |

*Primary Examiner*—Marc E. Bookbinder
*Assistant Examiner*—Tommy P. Chin
*Attorney, Agent, or Firm*—Oblon, Fisher, Spivak, McClelland & Maier

[57] ABSTRACT

The invention aims at obtaining an intermediate beat frequency from two millimeter wave frequencies by attenuating as much as possible the amplitude variations of the frequency coming from the local oscillator.

The mixer of the invention comprises two modules each containing a diode, one electrode of which is grounded to a conducting support. The modules are face to face. The diodes detect the electric field of the wave of the signal to be processed reigning in a cavity, and through conducting strips serving as outputs for the mixer and extending into a cavity where the electric field radiated by the local oscillator reigns, each module also detects a part of this electric field. The output terminals of the intermediate frequency are connected to an operational amplifier.

5 Claims, 14 Drawing Figures

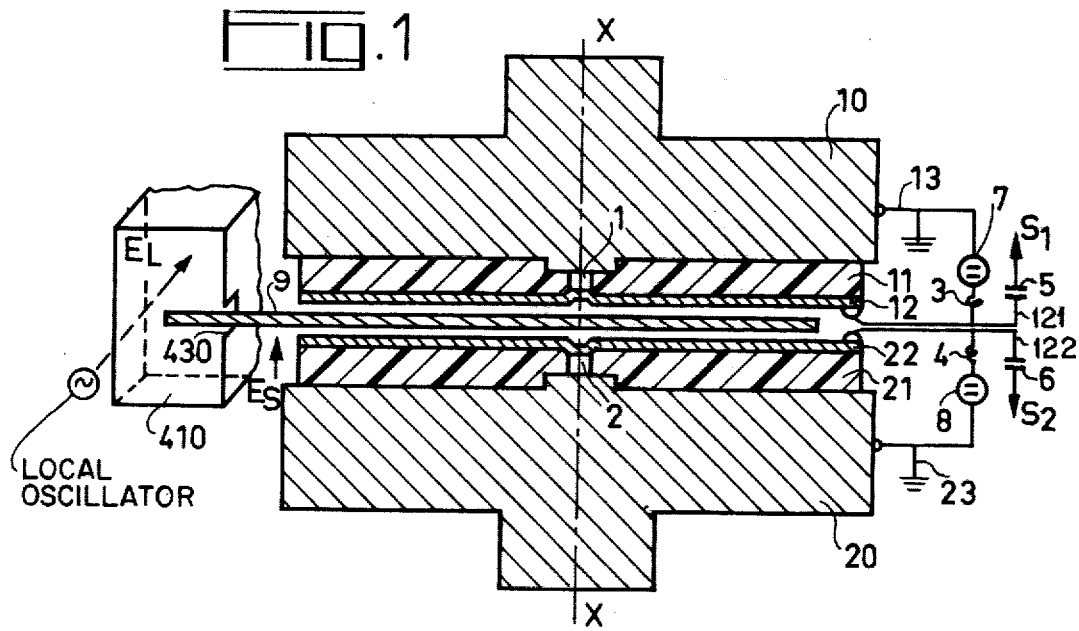
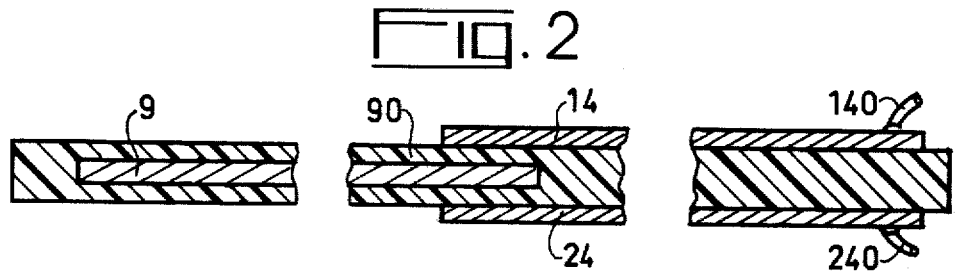
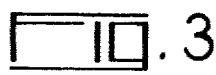
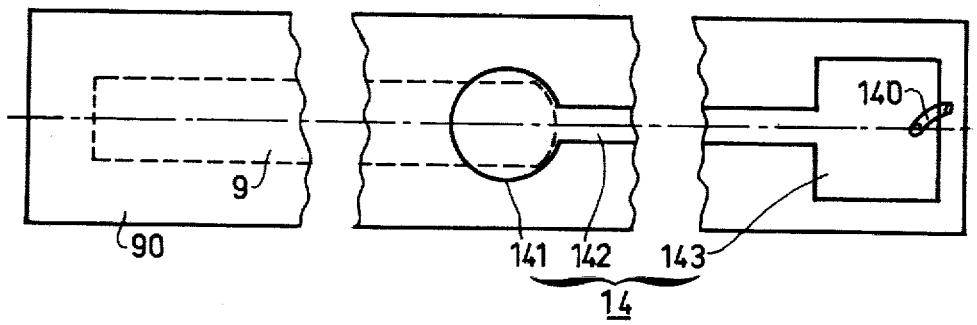

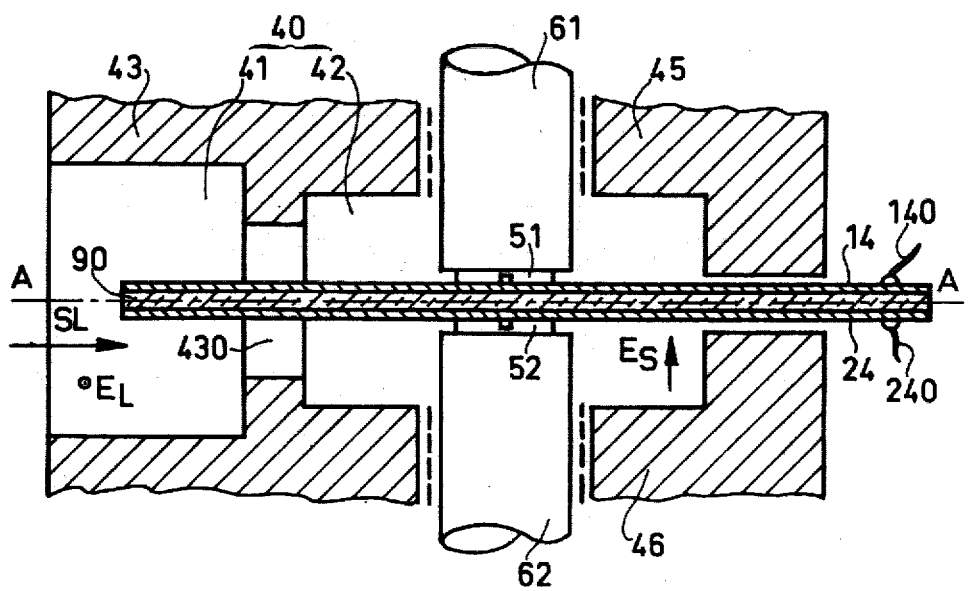
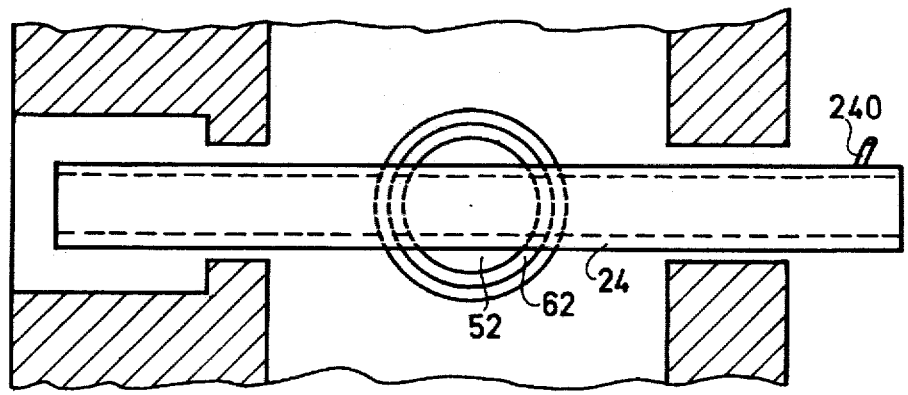

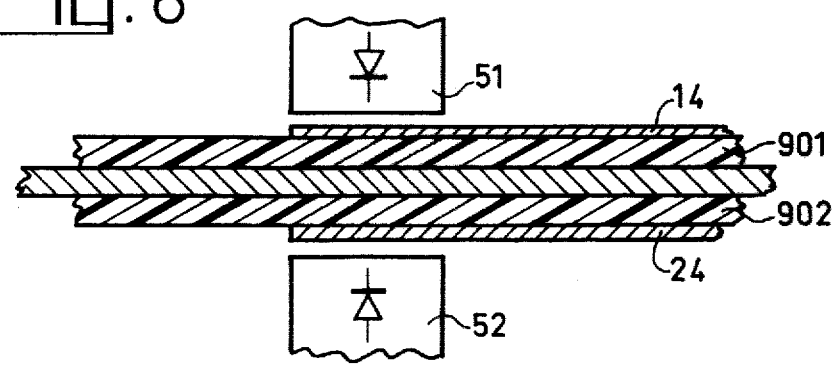
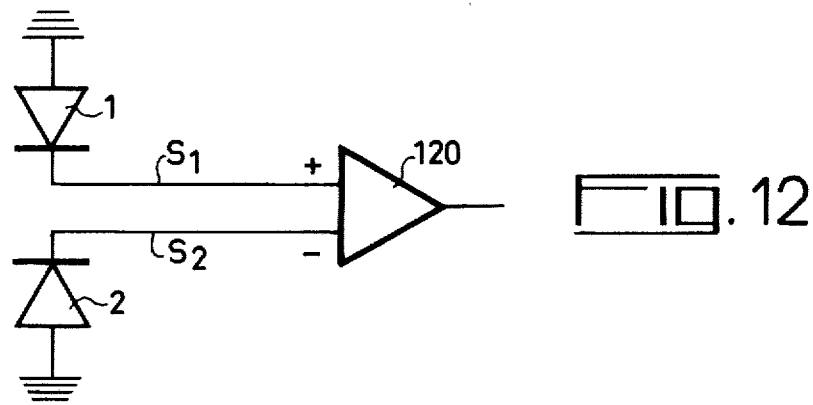
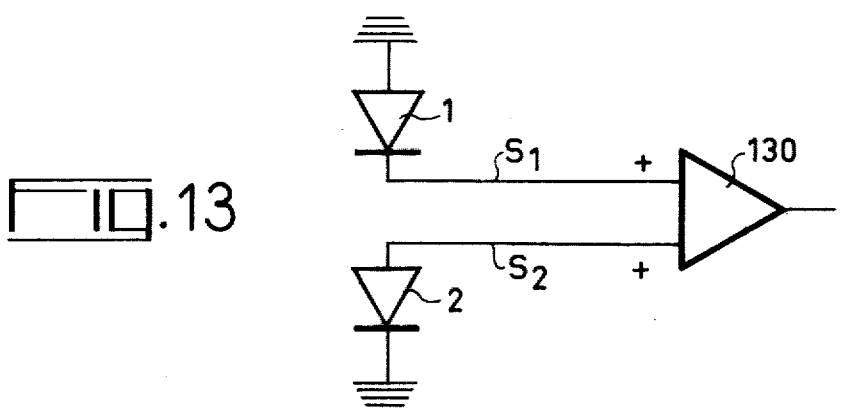

SYMMETRIC MIXER FOR MILLIMETER WAVES AND A RECEIVER USING SUCH A MIXER

BACKGROUND OF THE INVENTION

1. Field of the Invention

The invention relates to a symmetric mixer usable for millimeter wave frequency changing and an ultra high frequency radio-electric receiver using such a mixer.

2. Description of the Prior Art

For ultra-high frequencies, a symmetric mixer comprises two detector diodes, for example two Schottky diodes, each receiving at the same time the signal to be treated and the frequency of a local oscillator. The output signals of the two diodes, at the so-called intermediate frequency of the receiver, are added together, whereas the amplitude variations (amplitude noise coming from irregularities of the local oscillator) are subtracted, which allows for compensation of this defect.

In the construction of such a mixer, there are difficulties because, frequently, for millimeter waves, the signal to be processed and the local signal arrive through two separate wave-guides. In order to favor the signal to be processed, which often comes from an extremely small electro-magnetic field, the diodes are mounted directly in the wave-guide which conveys the signal to be treated. Several problems are then posed and in particular:

- the coupling of the two wave-guides by means of a common member;
- the coupling of the diodes with the electric fields of the two signals to be mixed;
- the arrangement of the biasing inputs of the diodes and of the intermediate frequency signal outputs.

The invention enables these problems to be resolved in the form of solutions advantageous from the industrial point of view.

SUMMARY OF THE INVENTION

The symmetric mixer for millimeter waves is of the type comprising two modules, each of these modules comprising a conducting support, a semi-conductor diode in contact with this support through one of its conducting electrodes, a layer of dielectric material placed on this support and surrounding the diode, and a metallization deposited on this layer and in contact with the other electrode of the diode. It is characterized in that the two modules are disposed face to face in an electro-magnetic field representing the signal to be processed, in that two connectors are connected to the metallizations of the modules and have each an output terminal for the mixer, and finally that a metallizations strip having one end inserted between the conducting and the other end plunged in an electro-magnetic field radiated by a local oscillator is capacitively coupled to the metallizations of the modules.

According to another embodiment of the invention, the symmetric mixer for millimeter waves is of the same type but is characterized in that two modules are disposed head to tail in an electro-magnetic field representing the signal to be processed, in that two parallel conducting strips are connected to the metallizations of the modules and have each an output terminal for the mixer, and in that further these strips have one end plunged in a magnetic field radiated by a local oscillator.

The above and other objects, features and advantages of the present invention will become apparent from the following description given solely by way of non limiting illustration, when taken in conjunction with the accompanying drawings.

DESCRIPTION OF THE FIGURES

FIG. 1 shows schematically a symmetric mixer constructed in accordance with the invention.

FIGS. 2 and 3 show, respectively in section and in a top view, one example of conducting strips used in one embodiment of the invention shown in FIG. 4.

FIGS. 4 and 5 show in two orthogonal sections one example of the symmetric mixer constructed in accordance with the invention.

FIGS. 6 and 14 show variations of the conducting strips.

FIGS. 7 to 13 show schematically variations of the invention.

DESCRIPTION OF THE PREFERRED EMBODIMENTS

Figure 7:
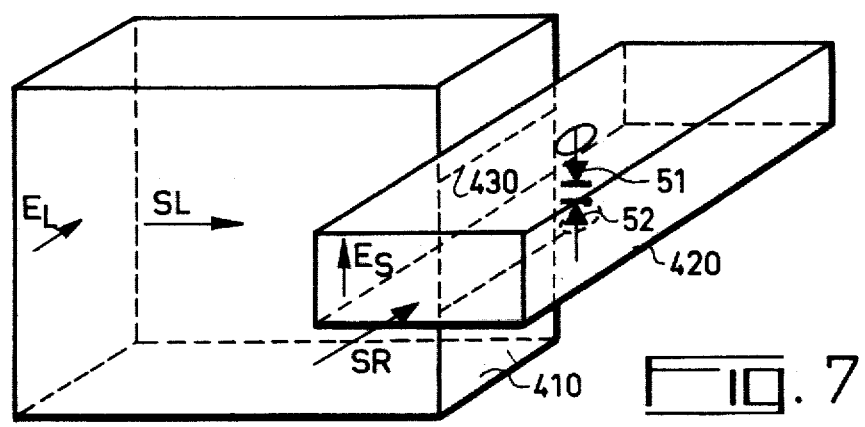

Diodes 1 and 2 are shown in section in FIG. 1 as forming each part of a module; the modules are disposed head to tail along a common axis XX. Each module comprises a heat and electricity conducting support 10 or 20, a deposit 11 or 21 of dielectric material surrounding the diode and a metallization 12 or 22 covering the other electrode of the diode as well as the free surface of the deposit 11. The diodes are for example of the Schottky type, being soldered on each side of the metal-semiconductor junction to the support 10 or 20. The other components of the mixer are shown in FIG. 1 in a purely theoretical way. Two ground connections 13 or 23 are provided and two connections 121 and 122 for applying a bias voltage to diodes 1 and 2 as well as the outputs of the signals beating at the so-called intermediate frequency. To this end, inductances 3 and 4 are disposed respectively in series with each of the bias sources 7 and 8 whereas capacitors 5 and 6 are inserted in the outputs $S_1$ and $S_2$ of the beat signal.

A conducting blade 9 is inserted between the two modules without electrical contact with the metallizations 12 and 22 or with connections 121 and 122. This blade has a conducting extension which penetrates through an opening 30 into a wave-guide 410 where the electrical component $E_L$ of the electro-magnetic field radiated by the local oscillator is parallel to blade 9.

The operation of the mixer is the following: the electrical component $E_L$ induces a high frequency current in blade 9. This blade radiates in its turn an electro-magnetic field having symmetrical electrical components $E_1$ and $E_2$ in relation to the plane of blade 9. The head to tail module unit is disposed in an electro-magnetic field whose component $E_S$ is parallel to the axis XX. This compenent is detected by the head to tail diodes giving phase opposed signals whereas components $E_1$ and $E_2$ give in phase detected signals. The beat signals which result therefrom in the two diodes appear in phase opposition at outputs $S_1$ and $S_2$. Such signals can be used in a conventional way by means of a differential amplifier to form a reception signal in which the noise due to the amplitude variations of the local oscillator is eliminated to a very large extent. The signals may also be added algebraically by means of a passive device, then amplified.

The coupling member shown in section in FIG. 2 and in a top view in FIG. 3 is one example of conducting strips 14 and 24 as well as of blade 9. It is formed from a three layer member of the printed wiring type containing conductors 14 and 24 in the end layers and blade 9 in the central layer, a dielectric 90 providing separation and insulation between the conducting layers. Conductor 14 comprises a circular part 141 for capacitive coupling with metallization 12 or 22 and a rectangle 143 receiving a connection 140, these two parts being joined together by a narrow conducting strip 142.

FIG. 4 is a section of a mixer 40 comprising two cavities 41 and 42 having a common wall 43. The same mixer is shown in FIG. 5 in a sectional view along AA of FIG. 4. Two modules 51 and 52 placed at the ends of threaded supports 61 and 62 each of which having the same dielectric material surrounding the diode and a metallization covering the other electrode of the diode as well as the free surface of the dielectric material as shown in FIG. 1 are placed in cavity 42 into which the supports penetrate by means of threaded portions provided in walls 45 and 46 of this cavity. A coupling member which is a variation of the one described and shown in FIGS. 2 and 3, is disposed between the modules.

In this variation, the conducting strips 14 and 24 are metallizations which each cover a very large part of each face of a dielectric foil 90. These strips fulfill then the functions of supplying the diodes with DC current, those of high frequency outputs, and finally those of member coupling with the electro-magnetic fields $E_L$ and $E_S$.

In FIG. 4 can be seen conductors 14 and 24 with their connections 140 and 240; in FIG. 5 there can only be seen foil 90 and, under the dielectric, the dotted line representation of conductor 24, as well as a connecting portion 240.

In FIG. 7 there is schematically shown the waveguides 410 and 420, a fraction of which is shown in FIG. 4 in the form of cavities 41 and 42. In this example of coupling the two guides through the opening 430 provided in their common wall, the wave of the local oscillator is propagated in the direction of the arrow SL orthogonal to the direction of the signal to be received whose wave is propagated in the direction of arrow SR. Moreover, the wall corresponding to the small side of the section of guide 420 is perpendicular to direction SL.

Figure 8:
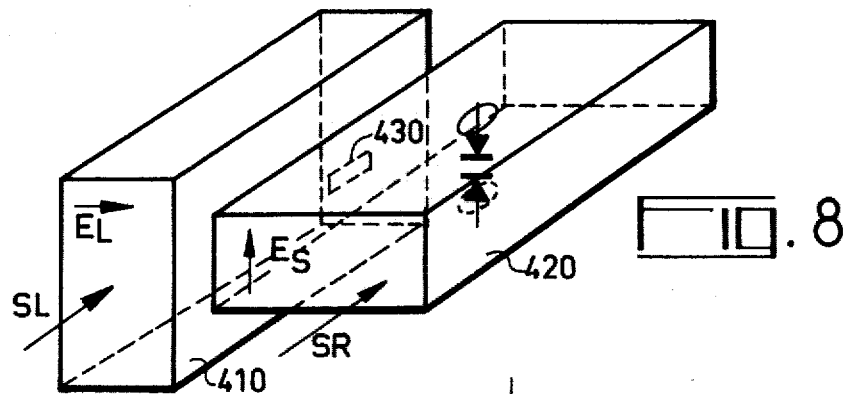
Figure 11:
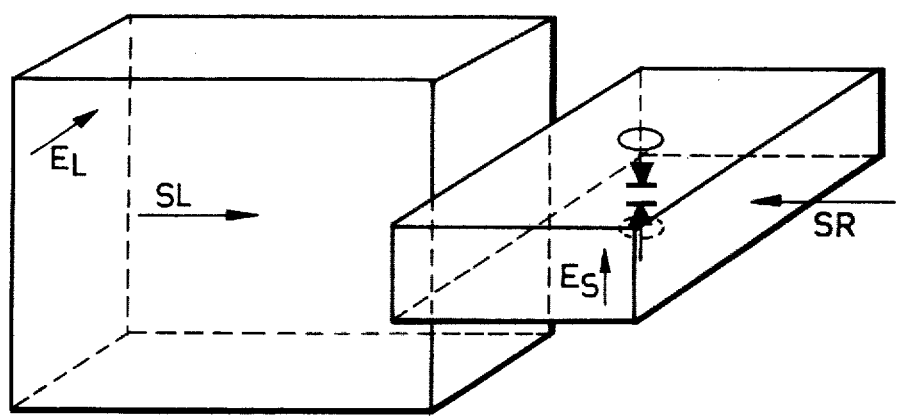

In FIGS. 8 and 11 there is shown schematically other possible arrangements of wave-guides 410 and 420. In all the solutions, the small sides of the guide sections are orthogonal so as to ensure orthogonality of the electric fields.

Figure 9:
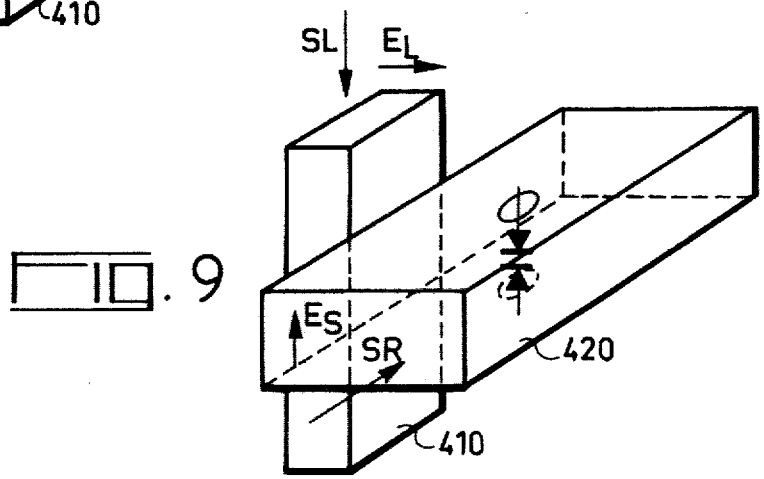
Figure 10:
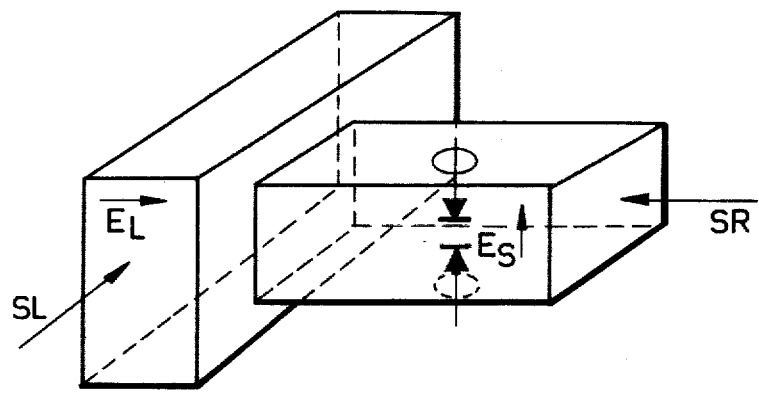

The directions of propagation of the local signal (SL) and of the signal to be received (SR) are, in the adopted variations:

parallel and in the same direction, as in FIG. 8;
parallel and in opposite directions, as in FIG. 11;
perpendicular to each other, with the following particularities:
the SL guide emerges into the SR guide through a small lateral face of the SR guide (FIG. 7).
the SR guide emerges into the SL guide through a lateral face of the SL guide, for example the large face, FIG. 10;
these two guides are coupled so that a small lateral face of one communicates with the other through an opening provided in a large lateral face of the other, as in FIG. 9.

In the arrangement of FIG. 7, the wave of the local signal is propagated perpendicular to the wave of the signal to be received.

In the arrangement of FIG. 8, the contacting walls of the guides correspond respectively to a small side and to a large side of the respective guides. Another solution, not shown, would be possible by permuting the two guides. Finally, guides 410 and 420 could be placed end to end.

In FIG. 6 a variation of the coupling means for modules 51 and 52 is shown symbolically. We find in this variation a conducting blade 9 clamped between two plastic material foils 901 and 902 carrying, by means of the printed wiring technique, conductors 14 and 24. Blade 9 may also be replaced by a conducting deposit carried by one face of foil 901 or 902, so on the side opposite the conducting layer 14 or 24.

In FIGS. 12 and 13 there are shown symbolically two types of mixer in accordance with the invention. In the first type, FIG. 12, which is that of the preceding examples, diodes 1 and 2 are head to tail. The outputs $S_1$ and $S_2$ of the intermediate frequency detected signals are connected to the two inputs of a differential amplifier 120. The bias connections have not been shown.

In the second type of mixer, FIG. 13, diodes 1 and 2 are disposed in the same direction in relation to the electric field of signal $E_S$, i.e. they are no longer head to tail. The intermediate frequency outputs $S_1$ and $S_2$ are connected to the symmetric inputs of an operational amplifier 130 which averages the two signals. An advantageous characteristic of this type of mounting comes from the fact that the two outputs can be connected to a single connecting wire.

Figure 14:
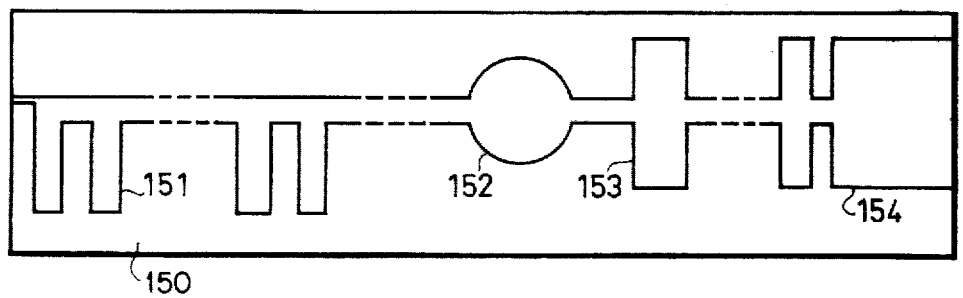

In FIG. 14 there is shown a variation of the conducting strips 14 and 24 defined in FIGS. 2, 3, 4 and 5. The dielectric foil which separates them is here a printed circuit 150 on two faces carrying symmetrical metallizations. In the centre of these metallizations there is provided a part 152 having a rounded contour and serving to make contact with the metallization of module 51 (or 52). On the side intended to penetrate into cavity 41 of guide 410 there are provided a number of denticles 151 and, on the opposite side, widened portions 153 terminating in a wide part 154. The denticles 151 serve to make excellent contact at high frequency with the walls of guide 410 while maintaining DC insulation, for the case where the diodes are to be biassed. The widened portions 153 are calculated so as to favor certain frequencies by a filtering effect: finally wide part 154 serves for soldering thereto a connection 140 (or 240).

The invention is applicable to a receiver for millimeter waves. The local oscillator of this receiver will feed into a wave-guide coupled by the above-described means to a wave-guide receiving the signal to be processed coming from the antenna of the receiver.

It is apparent that within the scope of the invention, modifications and different arrangements can be made other than are here disclosed. The present disclosure is merely illustrative with the invention comprehending all variations thereof.

What is claimed is:

1. A symmetric mixer for millimiter waves of the type comprising two modules, each of these modules comprising a conducting support, a semiconductor diode in contact with the support through one of its conducting electrodes, a layer of dielectric material placed on the support and surrounding the diode and a metallization deposited on said layer of dielectric material and in contact with the other electrode of the diode the improvement comprising: said two modules being disposed face to face in an electromagnetic field representing a signal to be processed, connections for said metallizations of the modules with each connection having an output terminal for the mixer and a conducting strip with one end inserted between the metallizations of the modules and the other end plunged in an electromagnetic field radiated by a local oscillator.

2. A symmetric mixer for millimeter waves, of the type comprising two modules, each of these modules comprising a conducting support, a semiconductor diode in contact with the support through one of its conducting electrodes, a layer of dielectric material placed on said support and surrounding the diode and a metallization deposited on said layer of dielectric material and in contact with the other electrode of the diode, the improvement comprising said two modules being disposed face to face in an electro-magnetic field representing a signal to be processed, two parallel conducting strips being deposited onto both faces of a dielectric foil inserted between the metallizations of the modules and each of said conducting strips having an output terminal for the mixer, and said parallel conducting strips and said foil having further one ends plunged in an electro-magnetic field radiated by a local oscillator.

3. The symmetric mixer as claimed in claim 2, wherein the two conducting strips are in the form of metallizations of a two face printed circuit.

4. The symmetric mixer as claimed in one of claims 1 or 2, wherein the diodes are disposed in opposite fashion in the two modules, the cathode of the one and the anode of the other being connected to ground whereas the anode of the one and the cathode of the other are connected to the signal outputs of the mixer.

5. A receiver for millimeter waves, using a symmetric mixer as claimed in any one of claims 1, 2 or 3, wherein the signal to be received and the signal of the local oscillator of the receiver are represented by the orthogonal electrical components of the electro-magnetic fields corresponding to each one of said signals.

* * * * *